(12) United States Patent
Van De Ven

(10) Patent No.: US 9,324,924 B2
(45) Date of Patent: Apr. 26, 2016

(54) TUNABLE REMOTE PHOSPHOR CONSTRUCTS

(75) Inventor: Antony P. Van De Ven, Hong Kong (CN)

(73) Assignee: Cree, Inc., Durham, NC (US)

( * ) Notice: Subject to any disclaimer, the term of this patent is extended or adjusted under 35 U.S.C. 154(b) by 835 days.

(21) Appl. No.: 13/039,743

(22) Filed: Mar. 3, 2011

(65) Prior Publication Data

US 2012/0224363 A1 Sep. 6, 2012

(51) Int. Cl.

| | |
|---|---|
| *H01L 33/00* | (2010.01) |
| *H01L 33/50* | (2010.01) |
| *F21K 99/00* | (2016.01) |
| *H01L 33/58* | (2010.01) |
| *F21V 3/02* | (2006.01) |
| *H01L 25/075* | (2006.01) |
| *F21Y 101/02* | (2006.01) |

(52) U.S. Cl.
CPC .............. *H01L 33/507* (2013.01); *F21K 9/135* (2013.01); *F21K 9/50* (2013.01); *F21K 9/56* (2013.01); *F21V 3/02* (2013.01); *H01L 33/505* (2013.01); *H01L 33/508* (2013.01); *H01L 33/58* (2013.01); *F21Y 2101/02* (2013.01); *H01L 25/0753* (2013.01); *H01L 2924/0002* (2013.01); *H01L 2933/0041* (2013.01)

(58) Field of Classification Search
CPC ............... F21V 9/08; F21V 9/10; F21V 3/02; H01L 33/507; H01L 33/505; H01L 33/508; H01L 33/58; H01L 25/073; H01L 2933/0041; H01L 2924/0002; F21K 9/135; F21K 9/50; F21K 9/56; F21Y 2101/02
USPC .............. 313/46; 439/29; 362/311.01, 311.06, 362/311.02
See application file for complete search history.

(56) References Cited

U.S. PATENT DOCUMENTS

| | | | | |
|---|---|---|---|---|
| 5,567,037 | A | * | 10/1996 | Ferber ........................... 362/104 |
| 2007/0228387 | A1 | | 10/2007 | Negley et al. |
| 2007/0268694 | A1 | | 11/2007 | Bailey et al. |
| 2009/0086475 | A1 | * | 4/2009 | Caruso et al. ................. 362/231 |
| 2009/0109687 | A1 | * | 4/2009 | Householder et al. ........ 362/309 |
| 2010/0264448 | A1 | * | 10/2010 | Choi et al. ....................... 257/98 |

FOREIGN PATENT DOCUMENTS

WO 2009098797 A1 8/2009

\* cited by examiner

*Primary Examiner* — Sharon Payne
(74) *Attorney, Agent, or Firm* — Dennis J. Williamson; Moore & Van Allen PLLC

(57) ABSTRACT

A solid state lighting comprising: at least one LED element positioned on a top surface of a substrate or a submount; and a polygonal structure comprising a plurality of edges forming a plurality of facets configured to receive light from the at least one LED element, the polygonal structure comprising a wavelength converting material, wherein the wavelength converting material is remotely positioned from the at least one LED element.

24 Claims, 9 Drawing Sheets

TUNABLE REMOTE PHOSPHOR CONSTRUCTS

TECHNICAL FIELD

The present disclosure relates to a solid state lighting element and a manufacturing method thereof, and more specifically, to a solid state lighting device comprising a polygonal structure comprising at least one wavelength converting material remote from the solid state lighting element.

BACKGROUND

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Often, the illumination devices for such applications are required to provide white light. White LED lights (i.e., lights which are perceived as being white or near-white) have been investigated as potential replacements for white incandescent lamps. A representative example of a white LED lamp includes a package of a blue light emitting diode chip, made of indium gallium nitride (InGaN) or gallium nitride (GaN), coated with a phosphor such as YAG. In such an LED lamp, the blue light emitting diode chip produces an emission with a wavelength of about 450 nm, and the phosphor produces yellow fluorescence with a peak wavelength of about 550 nm on receiving that emission. In some designs, white light emitting diodes are fabricated by forming a ceramic phosphor layer on the output surface of a blue light-emitting semiconductor light emitting diode. Part of the blue ray emitted from the light emitting diode chip passes through the phosphor, while part of the blue ray emitted from the light emitting diode chip is absorbed by the phosphor resulting in emission of a yellow ray. The part of the blue light emitted by the light emitting diode which is transmitted through the phosphor is mixed with the yellow light emitted by the phosphor. The viewer perceives the mixture of blue and yellow light as white light.

In another type of LED lamp, a light emitting diode chip that emits an ultraviolet ray is combined with phosphor materials that produce red (R), green (G) and blue (B) light rays. In such an "RGB LED lamp", the ultraviolet ray that has been radiated from the light emitting diode chip excites the phosphor, causing the phosphor to emit red, green and blue light rays which, when mixed, are perceived by the human eye as white light. Consequently, white light can also be obtained as a mixture of these light rays.

Generally known in the LED manufacturing art is the difficulty of tuning wavelength converting materials so as to provide a consistent, and reproducible target color point and/or color rendering index (CRI), which is a quantitative measure of the ability of a light source to accurately reproduce color in comparison with an ideal or natural light source. One of the difficulties in tuning the wavelength converting material results from the geometric shape of the globe on which the wavelength converting material is deposited. Other difficulties, alone or in combination with the globe shape include minor variations in wavelength converting material thickness, composition, presence of defects, and the like. Any of these defects can render the manufacturing process difficult as one or more of an array of LED elements can have slightly different color points. The manifestation of these difficulties in the application of wavelength converting material is especially apparent in the construction of omni-directional LED luminaries and in particular, omni-directional "white" LED luminaries.

There is an ongoing need for ways to use solid state light emitters, e.g., LEDs, to provide white light in a wider variety of applications, with greater energy efficiency, with improved color rendering index (CRI), with improved efficacy (lm/W), low cost and/or with longer duration of service.

SUMMARY

The present disclosure provides solutions to the above-mentioned problem by providing a wavelength converting material having or contained in a geometric shape suitable for assembly about one or more LED elements. In a general aspect, the wavelength converting material is provided essentially as a two-dimensional layer which is then configured into a 3-dimensional construct about the at least one LED element, the construct having a polygonal arrangement so as to approximate a globe or dome shape about the LED. By approximating a globe with a polygonal structure, tuning of the phosphor to provide a desired color point can be achieved. The polygonal arrangement can be fabricated from a flat, film or sheet material precursor or substrate, thus allowing for composition, concentration, thickness, and spatial arrangement or patterning of one or more wavelength converting materials utilizing conventional printing, deposition, or fabrication methods. The composition, concentration, thickness, and spatial arrangement patterning can be uniform or non-uniform on one or more polygonal facets and may differ from in neighboring facets. Using film material precursor phosphor sheets that are singulated as polygons provides for the process of punching, stamping, or casting polygonal constructs for assembly into a LED globe thus allowing for reproducible tuning of the phosphor globe and/or simplify the manufacturing process.

Thus, in a first embodiment, a solid state lighting device is provided. The device comprises at least one LED element positioned on a top surface of a substrate or a submount. A polygonal structure comprising a wavelength converting material, the polygonal structure comprising a plurality of edges forming a plurality of facets is configured to receive light from the at least one LED element, whereby the wavelength converting material is remotely positioned from the at least one LED element.

In a second embodiment, a method of tuning the color of light produced by a solid state lighting device is provided. The method comprises providing at least one LED element emitting one or more primary wavelengths of light, providing a polygonal structure comprising a plurality of edges forming a plurality of facets configured to receive the one or more primary wavelengths of light, the polygonal structure comprising at least one wavelength converting material, whereby the wavelength converting material is remotely positioned from the at least one LED element, and altering at least one of the primary wavelengths of light to provide at least one secondary wavelength of light.

In a third embodiment, a process of fabricating an optical element for a solid state lighting device is provided. The process comprising providing a polygonal structure comprising at least one wavelength converting material, wherein the polygonal structure comprises a plurality of edges forming a plurality of facets. The process includes controlling at least one of the following:

(i) the composition of the at least one wavelength converting material within or on the at least one of the plurality of facets, or in or on the film material; or (ii) the concentration of the at least one wavelength converting material within or on the at least one of the plurality of facets, or in or on the film material; or (iii) the thickness of the at least one wavelength converting material within or on the at least one of the plurality of facets, or in or on the film material; or (iv) the spatial arrangement of two of the at least one wavelength converting materials within or on the at least one of the plurality of facets, or in or on the film material.

In a fourth embodiment, a lighting device is provided. The lighting device comprising: a light source on a heat sink; a diffuser on said heat sink and spaced apart from said light source; and a polygonal structure comprising a wavelength converting material, the polygonal structure comprising a plurality of edges forming a plurality of facets configured to receive light from the light source, wherein the wavelength converting material is disposed between the light source and the diffuser and spaced from the light source and the diffuser, wherein said lighting device is arranged to fit within the A19 envelope while emitting a substantially uniform emission pattern.

DETAILED DESCRIPTION

Figure 1:
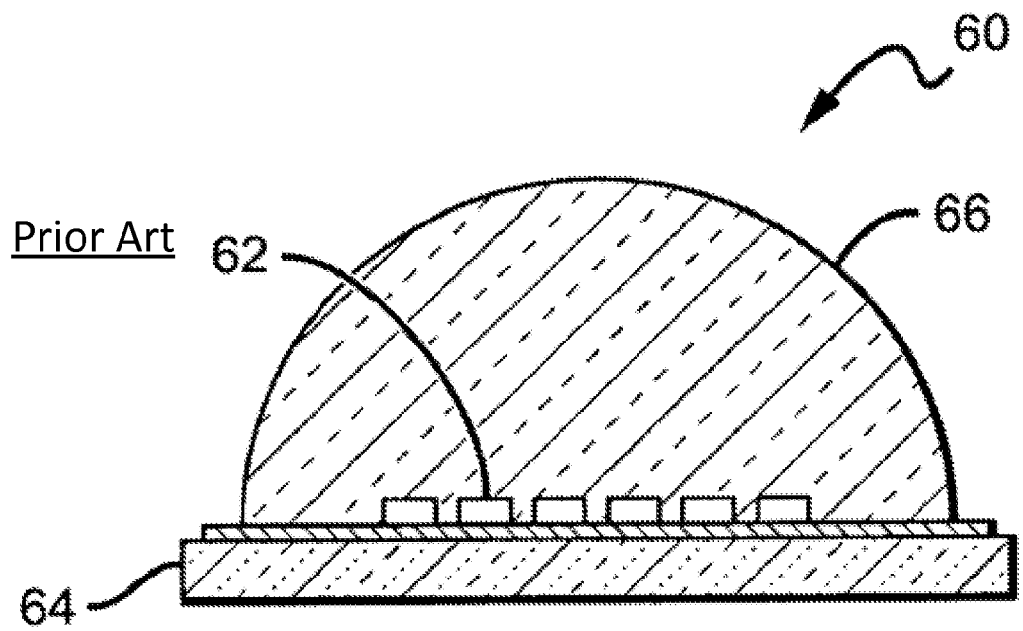
FIG. 1 shows a sectional view of an embodiment of prior art LED lamp.

A light emitting device comprising at least one LED element, an optical element formed of a polygonal shaped layer comprising a wavelength converting material are disclosed. The LED element, arranged for emitting primary light, is positioned on a carrier/substrate, the optical element formed of a polygonal shaped layer comprising the wavelength converting material is arranged at a distance from the LED element for improving color rendering, luminous efficacy, and/or minimizing loss of luminous flux attainable in mass production of the device.

An illumination device for illuminating an area or a room comprising such a light emitting device is also disclosed.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. It will be understood that these terms are intended to encompass different orientations of the element in addition to any orientation depicted in the figures.

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

The phrase "polygonal structure," as used herein encompasses simple, convex, and/or cyclic 3-dimensional (3-D) polygons. Thus, the polygonal structure can be a simple 3-D n-gon or "semi"-n-gon. For example, the 3-D n-gon can be any one of a semi-cylinder or semi-torus, a cone, a cuboid, a prism, a pyramid, and/or a frustum of a pyramid, and any combination of two or more of such polygons. The polygonal structure includes facets defined by a set of its edges, as would be readily understood, for example, by visualization of a 2-dimensional representation of the 3-dimensional polygonal structure. Regions illustrated in the figures of the present disclosure are schematic in nature and their shapes are not intended to illustrate the precise shape of a polygonal structure and are not intended to be limiting, for example, In one aspect, the polygonal structure is absent one facet for surrounding the LED element and/or one or more facets are used to bond the polygonal structure to the LED mount, submount, or other device component. In one aspect, the polygonal structure is a convex polygon, were all interior angles are less than 180°. In another aspect, the polygonal structure is a cyclic polygon were substantially all vertices lie on an imaginary (semi-) spherical outer surface, and includes n-gons having 20 edges, 50 edges, 100 edges, 500 edges, 1000 edges, 10,000 edges, or more, with obtuse internal angles greater than 90 degrees and up to but less than, 180 degrees, so as to represent a globe-like structure for encompassing at least one LED element in a hemispherical manner.

The phrase "wavelength converting material" is used herein to refer to any material or composition of matter that absorb light at one wavelength and re-emits light at a different wavelength, regardless of the delay between absorption and re-emission, and regardless of the wavelengths involved. Accordingly, the phrase "wavelength converting material" encompasses "phosphors" and "color shifting elements" and is used herein to encompass such materials that are fluorescent and/or phosphorescent and/or can be particles which absorb light having low wavelengths and re-emit light having longer wavelengths.

The phrase "wavelength converting layer," is used herein to refer to any layer(s) or similar structure comprising or consisting of one or more of a wavelength converting material (e.g., phosphor(s)). In one aspect, there can be provided a plurality of "wavelength converting layers," for example, each of the plurality represented individually by facets of a polygonal structure. A layer can be co-planar with another layer on a substrate, for example, two phosphor layers of different composition but similar (or different) thickness can be spatially arranged on a substrate as layers.

The phrase "optical element," and terms "globe," and "dome," and their grammatical equivalents, are used interchangeably herein encompasses essentially hemispherical, box-like, prism-like, or similar structures surrounding one or more LED elements and are inclusive of substantially transparent solid or hollow structures without limitation to any function. In certain embodiments, the phrase and terms "optical element," "globe," and "dome," exclude 3-D polygonal structures with less than 5 total edges, excluding the edges contacting (or forming part of) the substrate.

The phrase "spatial arrangement" as used herein, with reference to the wavelength converting material, encompasses complete or partial physical isolation of a volume of the material, as well as gradients of the material in one or more dimensions (length, width, height). Thus, the phrase "spatial arrangement" includes wavelength conversion materials, layers and carriers (and diffusers) being remote to one another. Remote in this context refers to being spaced apart from and/or to not being on or in direct thermal contact. For example, using lithographic techniques, a spatial arrangement of the wavelength converting material can be provided on a substrate, whereas isolated volumes of one or more wavelength converting material exist. For example, a predetermined pattern can be provided with areas/volumes substantially devoid of the material adjacent to areas/volumes comprising the material. Two isolated volumes can partially overlap in the substrate, so long as the adjacent regions measurably differ in their effect on impinging light. In another example, a random mixture of wavelength converting materials can be dispersed or distributed in a form or film material and discrete section of the form or film material can be photobleached, photo-etched (e.g. with intense laser light specific for one or more (or all) of either the form, film material, or the wavelength converting materials), or micro-machined so as to provide a spatial arrangement of wavelength converting materials as described above.

The phrases "predetermined composition" "predetermined concentration" "predetermined thickness" and "predetermined spatial arrangement" as used herein, with specific reference to the wavelength converting material, encompass an amount or value sufficient to alter, reflect, or attenuate wavelengths of light compared to the total absence of the wavelength converting material such that the alteration, reflection, or attenuation would be discernable by optical detection equipment normally used in the art. As actual values depend on the source LED intensity, distance, color, input power, etc., the actual predetermined values can be determined empirically or theoretically based on existing systems or models and the properties of the individual wavelength converting materials. These phrases also include an amount or value necessary for a known solid state lighting device design so as to achieve a target color point or color rendering index.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the present disclosure will now be described more fully hereinafter with reference to the accompanying drawings, in which embodiments of the invention are shown. This disclosure may, however, be embodied in many different forms and should not be construed as limited to the embodiments set forth herein. Rather, these embodiments are provided so that this disclosure will be thorough and complete, and will fully convey the scope of the claims to those skilled in the art. Like numbers refer to like elements throughout.

FIG. 1 shows a conventional monolithic LED package 60 comprising an array of LED chips 62 mounted on the surface of a submount 64 with conventional optical media 66 having a smooth surface and substantial absence of facets about the perimeter. At least some of the LED chips 62 are interconnected in a series circuit.

Figure 2:
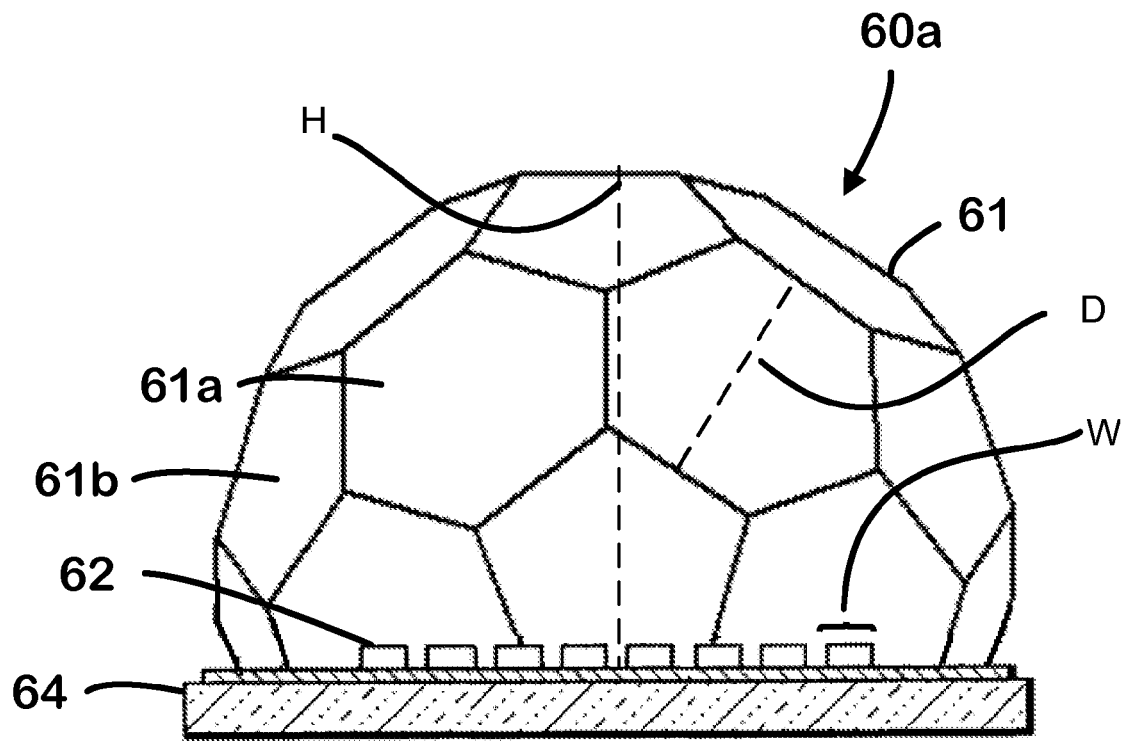
FIG. 2 shows a sectional view of an embodiment of an LED component according to the present disclosure.

FIG. 2 shows a monolithic LED component 60a comprising an array of LED chips 62 of width W mounted on the surface of a submount 64 in accordance with the present disclosure. In a manner as discussed below, optical element 61 comprising a polygonal structure comprising facets 61a, 61b having predetermined dimension D formed about LED chips 62. The width (or diameter) W of the LED chip 62 is preferably small, approximating a point light source. Optical element 61 extends a height H from the substrate 64. In certain aspects the dimension D of the facets 61a are of a ratio of about 10:1 compared to LED chips 62 width W. For example, for chip(s) of about 1 mm, the facet can be configured to be about 10 mm across. Other ratio of facet to chip width can be used. For example, if only one LED chip is used (e.g., a downlight configured luminary up to about 200 mm diameter), the ratio of facet to chip width can be about 2:1 up to about 200:1. If multiple LED chips are used, yet still based on a single die size, the ratio of facet to chip width can be about 2:1 to 2000:1, for example, such structures may include a fluorescent tube shape configuration comprising a plurality of 0.5 mm dies along a length of up to about 2 feet, 4 feet, or 8 feet or longer.

In one aspect, a polygonal structure comprising at least one phosphor provides the globe 61 hemispherically surrounding a collection/array of LED elements 62 positioned essentially in the centre of the globe mounted on the substrate 64. Globe 61 essentially provides for an equal optical path for the LED emitted light within the globe 61, irrespective of the radial direction of the LED(s) light. The internal volume of the globe 61 can be air and/or a substance having an appropriate difference in the refraction index as compared to the globe 61. The phosphors present in or on the globe 61 typically emit light evenly in all directions from any or all points about the globe shape. The light leaving the globe and observed by an observer can be essentially all of the light emitted by the phosphor or a portion of that light.

Figure 3:
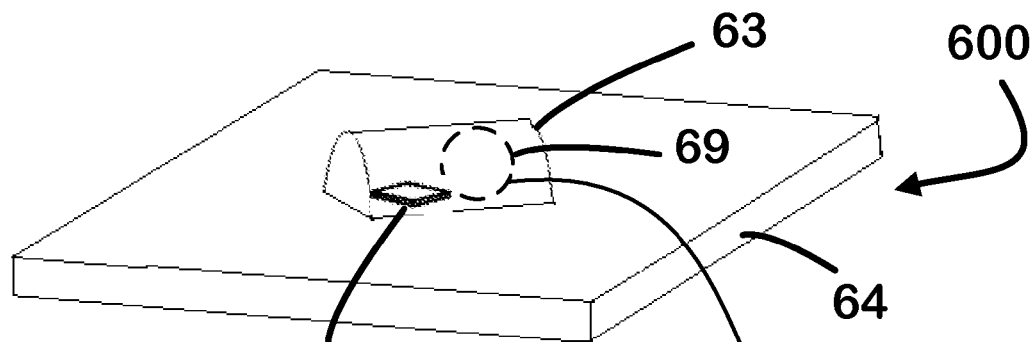
FIG. 3 is a perspective view representing an alternate embodiment of the present disclosure.
Figure 4:
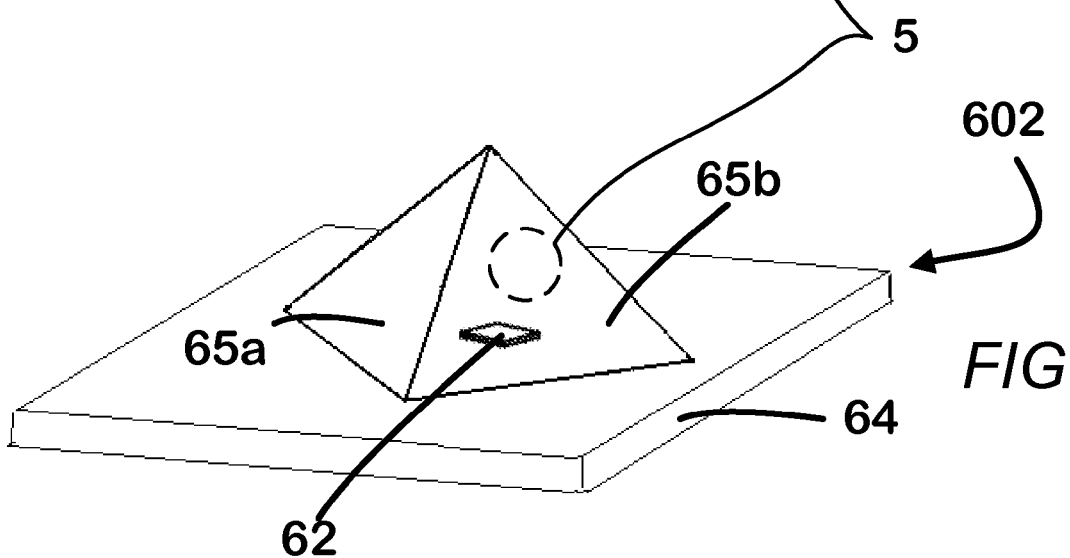
FIG. 4 is a perspective view representing an alternate embodiment of the present disclosure.
Figure 5:
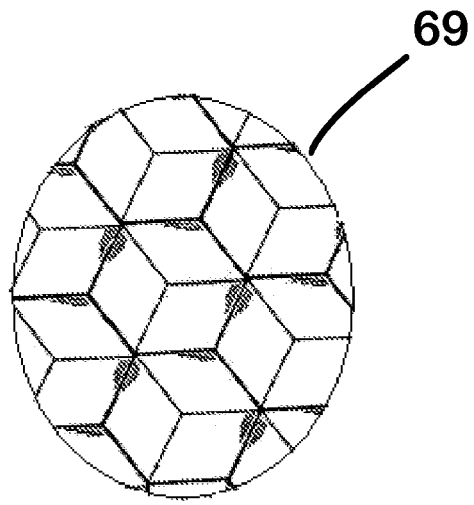
FIG. 5 is an exploded view of a surface corresponding to an embodiment of a surface of a LED component according to the present disclosure.

With reference to FIGS. 3, 4, and 5, alternate embodiments are presented in which the optical element is a polygonal structure 63 having two facets with a curved surface, as depicted by device 600. Surface or perimeter of curved surface 63 can be of a polygonal structure 69, as depicted in exploded view of section 5. Device 602 comprises polygonal structure 65 having four facets surrounding LED element 62.

Figure 6:
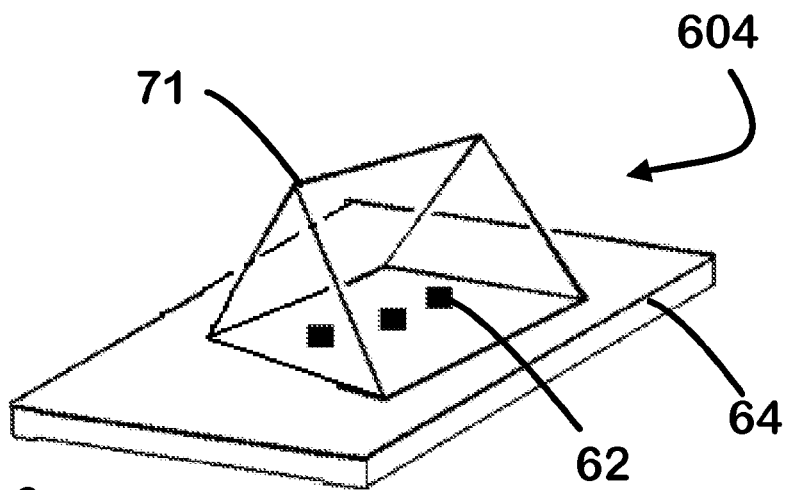
FIG. 6 is a perspective views representing alternate embodiments of the present disclosure.
Figure 7:
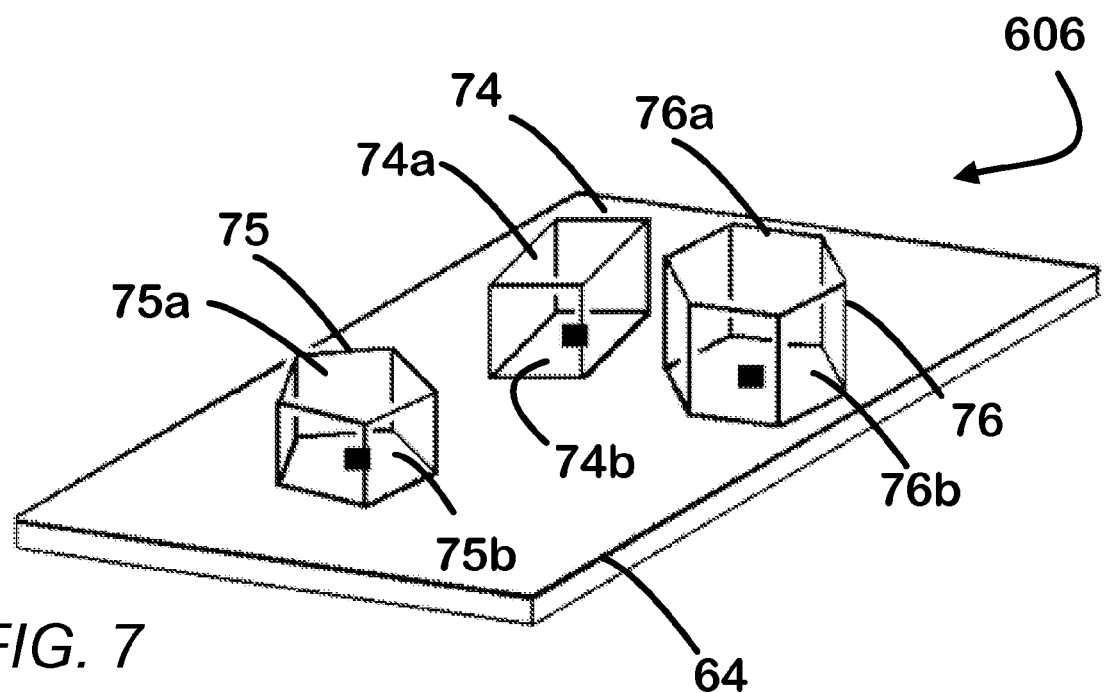
FIG. 7 is a perspective views representing alternate embodiments of the present disclosure.

With reference to FIGS. 6 and 7, device 604 comprises polygonal structure 71 having three facets surrounding LED element 62. Device 606 comprises a plurality of polygonal structures 74, 75, and 76, having five, six, and seven facets, respectively, surrounding LED element 62. For polygonal structures 74, 75, and 76, each have a top surface, 74a, 75a, and 76a, respectively, supported by corresponding side surfaces 74b, 75b, and 76b, respectively. Top surfaces 74a, 75a, and 76a, and side surfaces 74b, 75b, and 76b can be configured of a film material further discussed below, so as to further comprise polygonal structure, for example, as depicted in FIG. 5, or other polygonal structure.

The LED chips 62 are preferably mounted on a substantially planar surface of the submount 64 and are arranged under a single polygonal structured optical element. In other embodiments, the LED chips can be mounted on a non-planar substrate or submount. In the embodiments shown above, the component 60a can be configured to emit white light at a desired color point and color rendering index as a combination of light from the various LEDs. Use of the polygonal structured optical element in these configurations allows for tuning the color of light for the LED package.

In addition to the polygonal structured optical element embodiments discussed herein, the LED chips 62 can optionally be coated with one or more phosphors.

In one exemplary embodiment according to the present disclosure, the LED chips 62 are configured to provide a resultant white light, e.g., cool white or warm white. For example, LEDs chips 62 can have an LED that emits light in the blue wavelength spectrum and the phosphor absorbs some of the blue light and re-emits yellow, with the LED chips 62 emitting a white light combination of blue and yellow light. In one embodiment, the phosphor comprises commercially available YAG:Ce, although a full range of broad yellow spectral emission is possible using conversion particles made of phosphors based on the $(Gd,Y)_3(Al,Ga)_5O_{12}:Ce$ system, such as the $Y_3Al_5O_{12}:Ce$ (YAG). Other yellow phosphors that can be used for white emitting LED chips include, for example: $Tb_{3-x}RE_xO_{12}:Ce$(TAG); RE=Y, Gd, La, Lu; or $Sr_{2-x-y}Ba_xCa_ySiO_4:Eu$.

The LED chips 62 can be configured for emitting red light, for example, they can comprise LED structures and materials that permit emission of red light directly from the active region. Alternatively, in other embodiments, the LED chips 62 can comprise LEDs covered by a phosphor that absorbs the LED light and emits a red light. Some phosphors appropriate for these structures can comprise, for example: Red $Lu_2O_3:Eu^{3+}$ $(Sr_{2-x}La_x)(Ce_{1-x}Eu_x)O_4$ $Sr_2Ce_{1-x}Eu_xO_4$ $Sr_{2-x}Eu_xCeO_4SrTiO_3:Pr^{3+},Ga^{3+}$ $CaAlSiN_3:Eu^{2+}$ $Sr_2Si_5N_8:Eu^{2+}$ as well as SrxCa1−xS:Eu, Y; Y=halide; CaSiAlN3:Eu; and/or Sr2−yCaySiO4:Eu. Other phosphors can be used to create color emission by converting substantially all light to a particular color. For example, the following phosphors can be used to generate green light: SrGa2S4:Eu; Sr2−yBaySiO4:Eu; or SrSi2O2N2:Eu. The following lists some additional suitable phosphors used as wavelength converting materials, for example as particles in one or more layers, although others can be used. Each exhibits excitation in the blue and/or UV emission spectrum, provides a desirable peak emission, has efficient light conversion, and has acceptable Stokes shift:

| YELLOW/GREEN | RED |
|---|---|
| $(Sr,Ca,Ba)(Al,Ga)_2S_4:Eu^{2+}$ | $Lu_2O_3:Eu^{3+}$ |
| $Ba_2(Mg,Zn)Si_2O_7:Eu^{2+}$ | $(Sr_{2-x}La_x)(Ce_{1-x}Eu_x)O_4$ |
| $Gd_{0.46}Sr_{0.31}Al_{1.23}O_xF_{1.38}:Eu^{2+}{}_{0.06}$ | $Sr_2Ce_{1-x}Eu_xO_4$ |
| $(Ba_{1-x-y}Sr_xCa_y)SiO_4:Eu$ | $Sr_{2-x}Eu_xCeO_4$ |
| $Ba_2SiO_4:Eu^{2+}$ | $SrTiO_3:Pr^{3+}, Ga^{3+}$ |
| $Lu_3Al_5O_{12}$ doped with $Ce^{3+}$ | $CaAlSiN_3:Eu^{2+}$ |
| $(Ca,Sr,Ba)Si_2O_2N_2$ doped with $Eu^{2+}$ | $Sr_2Si_5N_8:Eu^{2+}$ |
| $CaSc2O4:Ce^{3+}$ | |
| $(Sr,Ba)2SiO4:Eu^{2+}$ | |

Other structures, arrangements, and combinations of single and/or multi-color LED-phosphor chips can be employed to provide a desired lighting effect, as is generally known in the art.

As an example, blue primary light may be partially converted to yellow light depending e.g. on the selected type(s) of phosphors. The combination of the blue and yellow light provides for a white luminance from the LED device. Different wavelength conversions are possible, depending on the phosphors. As an example, a plurality of different phosphor materials can be chosen and/or their composition, concentration, thickness, and/or spatially arrangement predetermined about or within one or more facets of a polygonal structure remotely positioned from one or more LED elements. In this manner, the polygonal structure with remotely positioned phosphor so arranged, can more uniformly and reproducibly convert the LED light into a collection of phosphor-emitted light of different wavelengths that provide a white luminance for the LED device advantageously for mass production of such LED luminaries. Thus, for example, when using a blue LED, the phosphor may be a YAG:Ce phosphor for a cool white light emission, and may optionally include additional phosphors for a desired light characteristic, such as blends containing red-emitting phosphors for increased color warmth. Other suitable phosphors may be used depending on the color of the light of the first wavelength range emitted from the LED and the particular color desired that determines the second wavelength range. As desired, off-white luminance can be provided by choosing the types of phosphors and the LED elements.

Still other embodiments can comprise different LED chips with LEDs emitting at different wavelengths. For example, in any of the LED chip configurations above in which at least one of the emitters comprises a short wavelength emitter in conjunction with one or more phosphor emitters, an ultraviolet emitting LED can be used as the LED. For example, a film material that forms the polygonal structured globe, for example, preferably is substantially transparent in the UV region associated with the ultraviolet emitting LED (e.g., polydimethylsiloxane, aliphatic polyurethanes, polyacrylates, polynorbornenes, and derivatives, etc.). This results in the predominant emission component of the LED chips coming from the phosphor excited by the ultraviolet LED. By way of example, each of the following phosphors exhibits excitation in the UV emission spectrum, provides a desirable peak emission, has efficient light conversion, and has acceptable Stokes shift, for example: Yellow/Green: $(Sr,Ca,Ba)(Al, Ga)_2S_4:Eu^{2+}$ $Ba_2(Mg,Zn)Si_2O_7:Eu^{2+}$ $Gd_{0.46}Sr_{0.31}Al_{1.23}O_xF_{1.38}:Eu^{2+}{}_{0.06}$ $(Ba_{1-x-y}Sr_xCa_y)SiO_4:Eu$ $Ba_2SiO_4:Eu^{2+}$.

The polygonal structured globe provides for the specific disposition of one or more phosphor substances at a distance from the LED element (e.g., remote phosphor configuration). The phosphors can be spatially arranged about the globe in any predetermined geometric pattern or can be randomly disposed in or on the globe. The phosphors can be comprised of a plurality of layers of varying thickness and/or composition and/or concentration. Thickness of the phosphor layers can vary in the entirety of the layer, or in discrete sections of the layer, and/or be gradient. Thickness of the phosphors and phosphor concentration and composition in the polygonal shaped layer can be achieved using conventional printing and/or photolithographic techniques and/or in combination with spray coating deposition/masking/developing/etching or polishing techniques known in the art. Directly coating the wavelength converting material to a predetermined thickness will provide a concentration commensurate with the thickness coated. One or more films with the wavelength converting material is in or on can be used to provide a predetermined thickness, concentration, and/or composition. The one or more films can have different thicknesses depending at least partially on the predetermined concentration of phosphor material and the desired amount of light to be converted by the plurality of layers. A typical predetermined concentration of wavelength converting material includes a range of 30-70% by weight, such as in one or more film layers. In one embodiment, the wavelength converting material concentration is approximately 65% by weight. A plurality of layers according to one aspect of the present disclosure can be applied with concentration levels (phosphor loading) above 30% by weight. Other embodiments can have concentration levels above 50% by weight, while in still others the concentration level can be above 60% by weight. In one embodiment, the wavelength converting material has different predetermined regions (spatial arrangements) with different, predetermined compositions of wavelength converting material and/or different predetermined concentrations of wavelength converting material.

In some embodiments, the phosphor layer can have thicknesses in the range of 10-100 microns, while in other embodiments it can have thicknesses in the range of 40-50 microns. In certain aspects, the methods presently disclosed provide for controlled thickness of the phosphor(s) where the phosphor is deposited on the film (as opposed to being mixed in the film material) around a predetermined thickness, e.g., 30-40 um, with a control of thickness variation (pre- or post-deposition) of +/−10%, 5%, or 1%. The predetermined thickness targeted by the concentration and/or composition of the phosphor (and any binding material), the intensity of the light that illuminates the area on the structure and the optical characteristics of any binder and/or other dispersants present in the coating or the polygonal structure or the substrate. A typical distance between the LED element and the furthest remote point on the globe can be between 0.1 mm and 80 mm, or longer.

The methods described above can be used to apply multiple layers of the same of different phosphor materials and different phosphor materials can be applied in different areas of the film material using known techniques, such as masking processes. Other embodiments can comprise uniform and/or non-uniform distribution of phosphors in the film material, such as with different phosphor layer thicknesses and/or different phosphor material concentrations spatially arranged in the film material. There can be multiple areas of different types of phosphors that can emit the same or different colors of light, such as by having distinct regions of different phosphors. Some of these arrangements can give the phosphor containing film material a patterned appearance, with some of the patterns including but not limited to striped, dotted, crisscrossed, zigzagged or any combination of these or other geometric arrangements.

The methods described above provide some thickness control for the film material (coated or comprising the wavelength converting material), but for even greater thickness control the layer of coated phosphor can be ground using known methods to reduce the thickness or to even out the thickness over the entire layer. This grinding feature provides the added advantage of being able to produce lamps emitting within a single bin on the CIE chromaticity graph. Binning is generally known in the art and is intended to ensure that the LEDs or lamps provided in groups that emit light within an acceptable color range.

Different sized wavelength converting materials, in the form of particles can be used including but not limited to particles in the range of 10 nanometers (nm) to 30 micrometers (μm), or larger. Smaller particle sizes typically scatter and mix colors better than larger sized particles to provide a more uniform light. Larger particles are typically more efficient at converting light compared to smaller particles, but emit a less uniform light. In some embodiments, one or more wavelength converting materials can be provided in as a layer in a binder, and the wavelength converting materials can also have different predetermined concentrations or loading of wavelength converting materials in the binder.

Suitable binder materials for the wavelength converting materials include silicones, epoxies, glass, inorganic glass, dielectrics, BCB, polymides, polymers and hybrids thereof, with the preferred material being silicone because of its high transparency and reliability in high power LEDs. Suitable phenyl- and methyl-based silicones are commercially available from Dow® Chemical. The binder can be cured using many different curing methods depending on different factors such as the type of binder used. Different curing methods include but are not limited to heat, ultraviolet (UV), infrared (IR) or air curing. In some embodiments, the binder can comprise a polymeric material or plastic and this binder or plastic can provide the film material for forming the polygonal structure The wavelength converting materials can be applied using different processes including but not limited to spin coating, sputtering, printing, powder coating, electrophoretic deposition (EPD), electrostatic deposition, among others. The wavelength converting materials can be applied along with a binder material, but it is understood that a binder is not required. In still other embodiments, wavelength converting materials in the form of one or more layers can be separately fabricated and then mounted to the carrier or shaped in a polygonal structure.

In one embodiment, a wavelength converting material-binder mixture can be sprayed or dispersed over a suitable film material with the binder then being cured to form the wavelength converting materials layer, for example, prior to forming the polygonal structure.

In one aspect, the present disclosure provides for solid state lighting device where two or more of the plurality of facets of the polygonal structure can independently comprise at least two of: a predetermined composition of wavelength converting material; a predetermined concentration of wavelength converting material; a predetermined thickness of wavelength converting material; and at least two wavelength converting materials in a predetermined spatial arrangement within the facet or neighboring facets. In another aspect, a solid state lighting is provided where at least two LED elements emit light of different wavelength and two or more of the plurality of facets independently comprises at least two of: a predetermined composition of wavelength converting material; a predetermined concentration of wavelength converting material; a predetermined thickness of wavelength converting material; and at least two wavelength converting materials in a predetermined spatial arrangement within the facet or neighboring facets.

Methods of Forming Polygonal Structure Optical Elements

In another embodiment of the present disclosure, methods of forming the polygonal structure for a LED luminary is provided. The embodiments presently disclosed provide for the manufacture of an effective optical structure that enables tuning of the emitted light from the LED element using wavelength converting material that is substantially constant as to the transparency and reflectivity of the wavelength converting material, thus providing for reproducible manufacturing of the LED device.

Thus, in a first aspect, a manufacturing method is provided comprising providing a solid state lighting device, forming a polygonal shaped layer comprising a wavelength converting material, providing a predetermined thickness and/or concentration of wavelength converting material, and forming a globe from the polygonal shaped layer at least partially surrounding the solid state lighting device. The polygonal shaped layer formed as a globe provides for the disposing of a wavelength converting material at a distance from the LED element that can be tuned to provide a controllable thickness and/or concentration of wavelength converting material. The wavelength converting material is capable of converting at least a part of the primary light to a wavelength different from the wavelength of the primary light. A globe-like optical structure is provided from the polygonal shaped layer that faces the LED element. The resultant optical structure is arranged for receiving all or part of the light from the LED element(s), and for providing light from the wavelength converting material and the LED element. The globe-like optical structure provided from the polygonal shaped layer can be configured for transmissively and/or reflectively tuning the light from the LED element(s) so as to provide for a predetermined color point. For example, the formed polygonal structure can be photo-bleached or photo-etched with intense laser light specific for one or more (or all) of the wavelength converting materials or the material forming the polygonal structure so as to provide a predetermined composition, concentration, thickness, and/or spatial arrangement of wavelength converting materials. Other methods of altering the polygonal structure's content of wavelength converting material can be used, including photolithographic techniques and materials used in 3-D rapid prototyping, computer numerical control (CNC) machining, and the like. The globe-like optical structure provided from the polygonal shaped layer can also provide for redirecting the part of the wavelength converting material emitted light in a direction towards the substrate/reflecting elements and away from the LED element.

The embodiments presently disclosed are beneficial from a manufacturing point as a predetermined optical structure of defined characteristics can be fabricated by controlling the structure and composition of the polygonal shaped layer. The embodiments presently disclosed are advantageous in that the LED emitted lights effectively tuned by the globe formed by the polygonal shaped layer comprising the wavelength converting material. The embodiments presently disclosed is beneficial in that the optical path for the LED emitted light in the wavelength converting material is controlled to a greater precision for all emitting angles thereby allowing superior color point achievement for the component. The polygonal shaped layer can be relatively easily manufactured and economically and efficiently shaped to provide the globed optical structure. The above embodiments can be combined with conventional reflector elements/mountings further reducing the amount of wavelength converting light directed towards the LED element, therefore reducing absorption losses.

Figure 8:
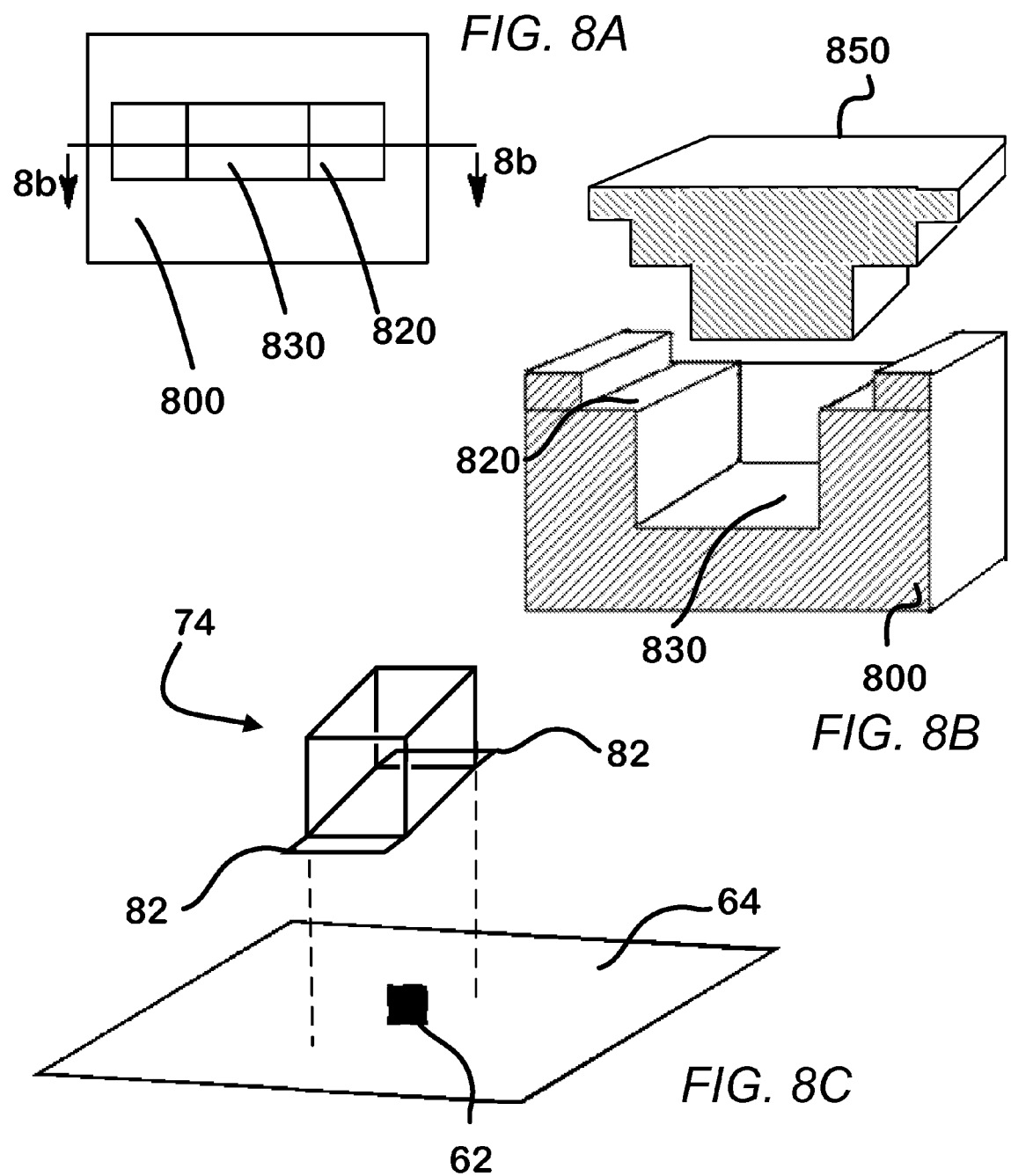
FIG. 8A is a top view of a die corresponding to an embodiment of a LED globe component fabrication process according to the present disclosure.
FIG. 8B is sectional view of the die represented by FIG. 8A.
FIG. 8C is a perspective view of a LED globe component bonding process embodiment according to the present disclosure.

Thus, referring now to FIGS. 8A and 8B, is a top view and sectional view along line 8B of a female die 800 for stamping or otherwise (vacuum) thermo-forming a polygonal structure, for example, from a film material or casting, providing for the polygonal structure to comprise an opening to at least partially surround one or more LED elements. Cavity 830 with shallow shelves 820 receives film material (not shown) and using a complementary male die 850 polygonal structure 74 is produced which, as shown in FIG. 8C, can be mounted with the aid of attachment portions 82 for bonding with substrate 64 to hemi-spherically surround LED element 62 and/or can be quickly and easily mounded and aligned to components, such as a heat sink, etc. Additional attachment portions (e.g., a partial or complete perimeter) can be provided and used to completely secure the polygonal structure to the substrate. Ultrasound welding or heat can be used to bond the polygonal structure to the substrate. Other polygonal shapes can be constructed using combinations of female/male dies. In a preferred aspect, the polygonal shape approximates that of a semi-spherical or hemispherical shape. The film material can contain the wavelength converting materials or they can be coated on the formed polygonal structure afterwards. In one aspect, the formed polygonal structure can then be photo-bleached or photo-etched with intense laser light specific for one or more (or all) of the wavelength converting materials, or the film material can be treated similarly prior to forming the polygonal structure, so as to provide a predetermined composition, concentration, thickness, and/or spatial arrangement of wavelength converting materials. Other methods of altering the forming material's or the polygonal structure's content of wavelength converting material can be used, including photolithographic techniques and materials, e.g., as used in 3-D rapid prototyping, computer numerical control (CNC) machining, and the like.

Figure 9:
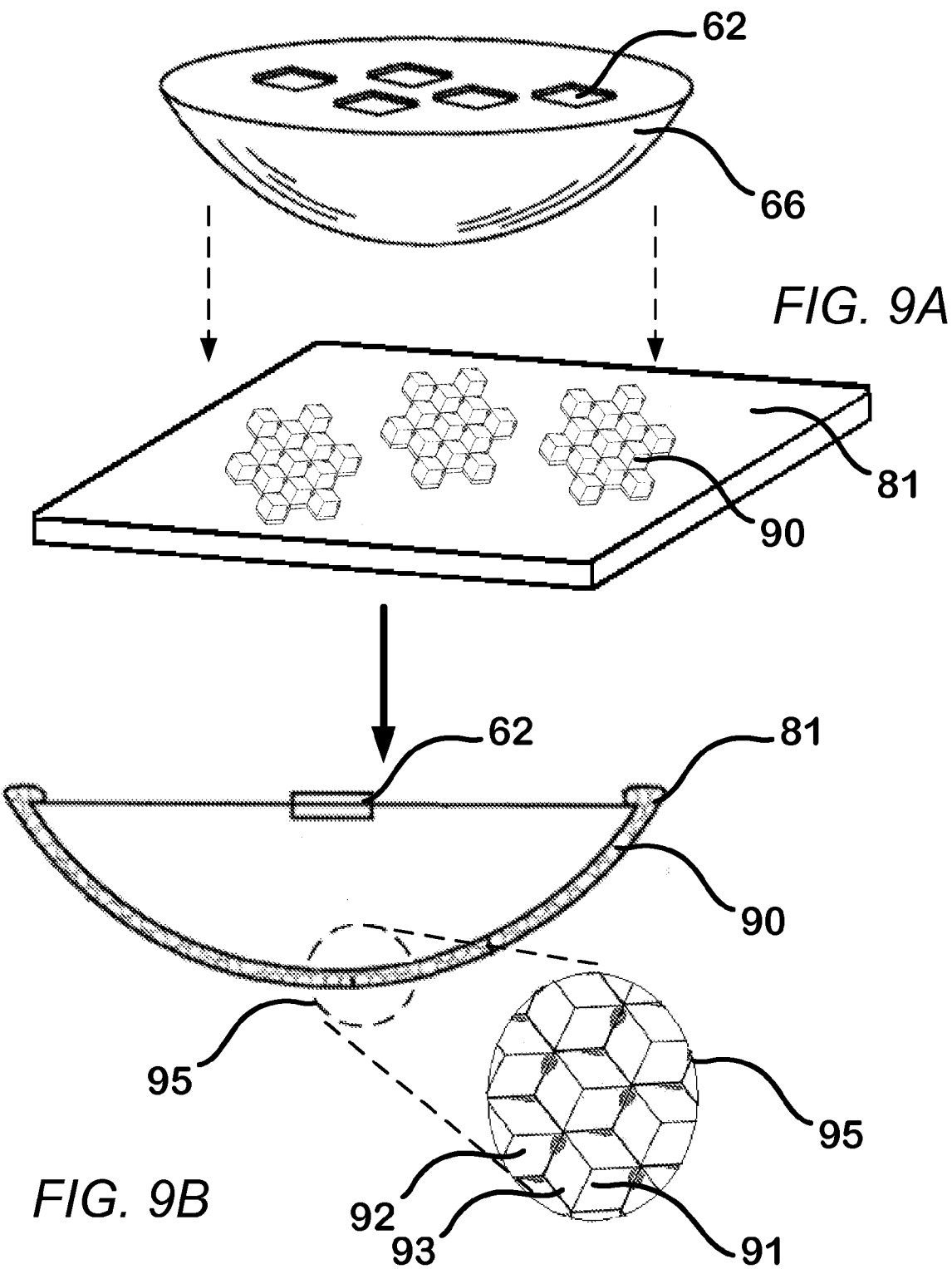
FIGS. 9A and 9B show perspective views of a LED globe component fabrication process embodiment according to the present disclosure.

Referring now to FIGS. 9A and 9B, a second aspect of manufacturing process for the polygonal structure optical element is provided. Thus, LED elements 62 encased in optical media 66 (e.g. light transparent polymer), which can be subsequently formed into a polygonal structure using a die or micro- or macro-machining, laser etching, CNC machining, and the like. Alternatively as shown, LED elements 62 encased in optical media 66 is configured to receive film material 81 comprising polygonal structure 90, which is formed around the outer perimeter of optical media 66 to provide device 99 to hemi-spherically surround LED element 62. Surface of film material 81 provides polygonal structure 90 having discrete regions (e.g. facets 91, 92, 93) of polygonal structure as shown in exploded view 95 for independently controlling and/or arranging wavelength converting materials as to their respective thickness, concentration, and spatial relationship.

Figure 10:
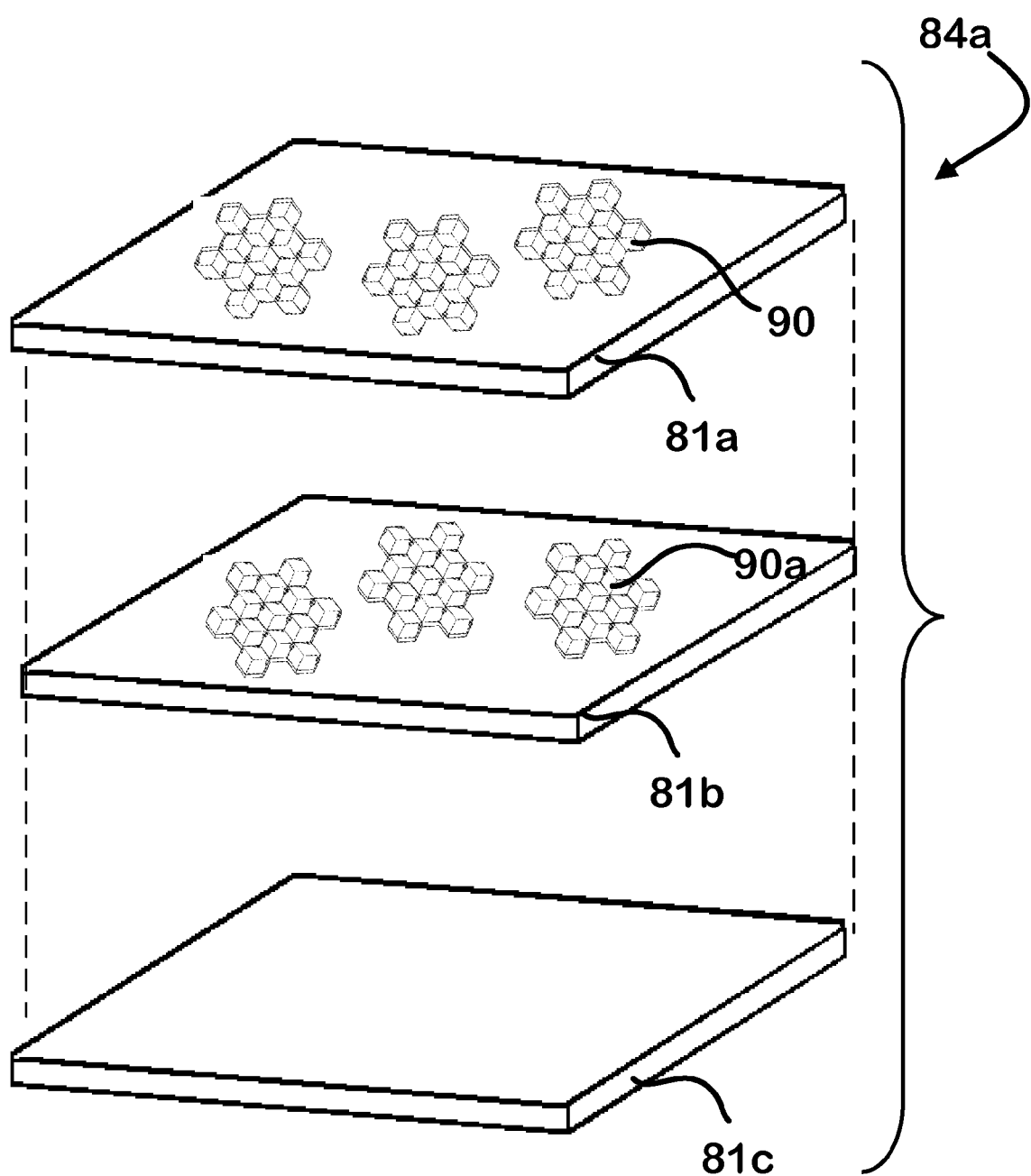
FIG. 10 is an exploded view of a film material embodiment according to the present disclosure.
Figure 11:
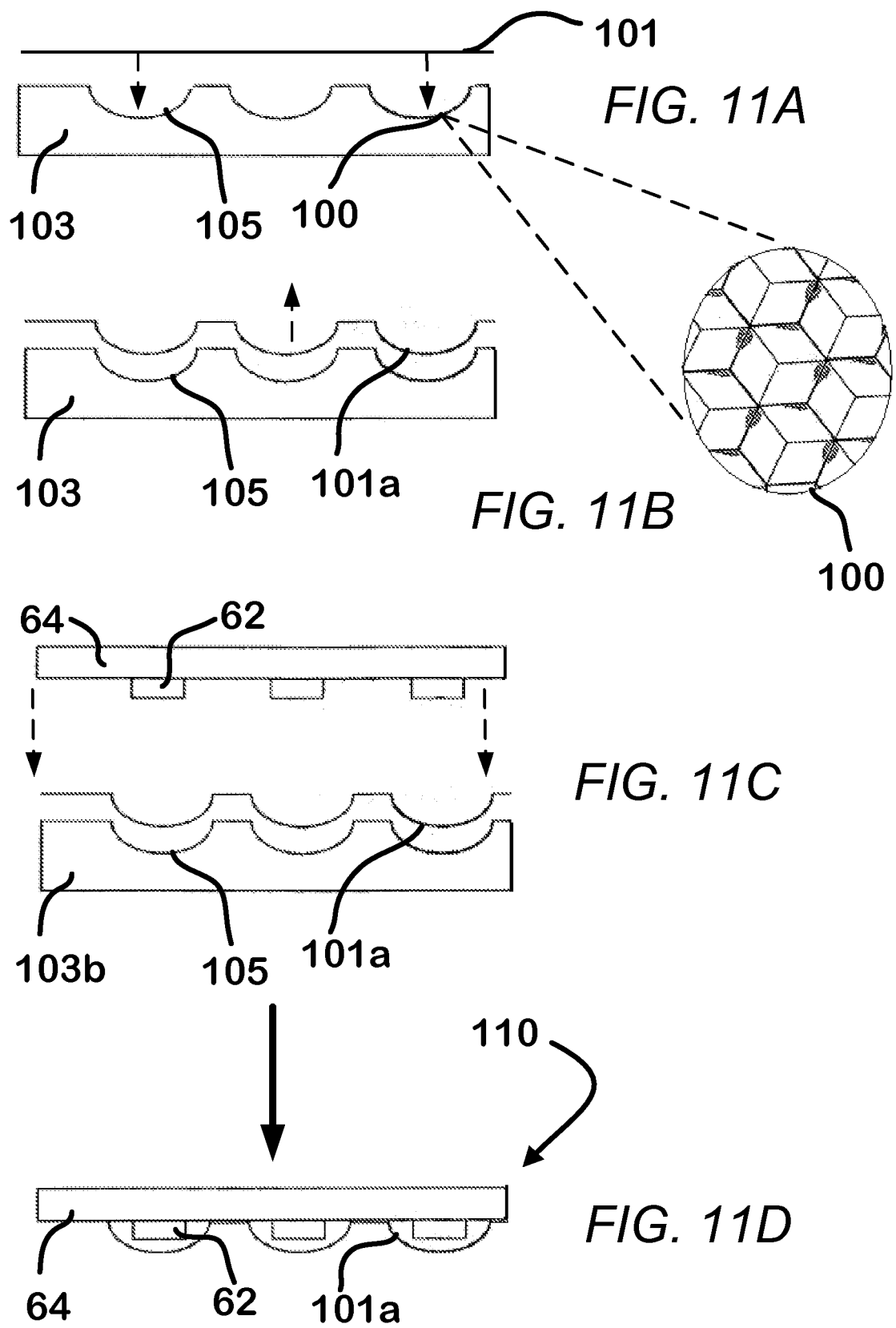
FIGS. 11A-11D are perspective views of a LED globe component fabrication embodiment according to the present disclosure.

Film material 81 can comprise multi-layers of film material, e.g., is a laminate, each layer or a single layer independently having polygonal structure and/or having, independently, a predetermined composition, concentration, and/or thickness and/or spatial arrangement of wavelength converting materials, or no wavelength converting material. Thus, with reference to FIG. 10, film material 81a is exemplified by first layer 81a having a predetermined concentration and/or thickness and/or spatial arrangement of wavelength converting materials in polygonal structure 90, disposed on second layer 81b having a predetermined composition, concentration, thickness and/or spatial arrangement of wavelength converting materials in polygonal structure 90a. Third layer 81c can be devoid of wavelength converting material or have a uniform thickness/dispersion/concentration of wavelength converting material. The combined layers can each be independently of a thickness and/or durometer or stiffness suitable to support the polygonal structure, bond to the substrate, and contain the wavelength converting material. Wavelength converting material, different wavelength converting materials and/or equal or unequal amounts of one or more wavelength converting materials can be distributed among one or more of the multi-layers. Combinations of the above described configurations of wavelength converting materials can be employed. Conventional photolithographic techniques can be used on one or more of the laminate layers of film material 81 to control the composition, concentration, thickness, and/or spatial arrangement of the one or more wavelength converting materials. Such techniques can be used on one or more of the individual layers of the laminate or after providing the laminate film material 81. In another example, a random mixture of wavelength converting materials can be dispersed or distributed in one or more layers of the laminate and predetermined (discrete or patterned) sections of the film can be photo-bleached or photo-etched with intense laser light specific for one or more (or all) of the wavelength converting materials so as to provide a spatial arrangement of wavelength converting materials. The layers of the laminate upon overlaying can provide another level of spatial arrangement of the wavelength converting materials.

The size of the optical media 66 depends on the particular application and the number of LED dies mounted, and may be, for example, several centimeters in diameter. The film material 81 may be rigid or semi-rigid curable silicone so that the film material can contact the optical media 66 without gaps. The film material may be thin, for example about 1 mm or can be thick, up to 10 mm. The film material also can be secured to the media 66 with an adhesive or an encapsulant can be used.

With reference to FIGS. 11A-11D, a third aspect of manufacturing process for the polygonal structure optical element is provided wherein film material 101, pre-configured with a predetermined concentration and/or thickness and/or spatial arrangement of wavelength converting material, is formed to a polygonal structure 101' with surface structure 101a imparted by die 103 having structured cavity 105 with structure exemplified by exploded sectional view 100. Surface of cavity 105 can be formed by laser etching, stamping, and other tool & die techniques. Film material 101 can be fabricated using conventional masking, developing, depositing, and/or etching methods to create the predetermined compositions, concentrations and/or thickness and/or spatial arrangements of wavelength converting material. Formed and structured film material 101a is arranged for receiving by submount 64 and LED element 62, so as to provide LED luminary 110. In one aspect, substrate 64 and the film material 101 are of the same material.

The film material 101 may be made by mixing the phosphor into a suitable transparent material, where the amount of the phosphor is determined based on a thickness of the film material, and the material mixture may be poured into a mold having polygonal structures of varying depths to provide different relative thickness/concentrations of phosphor in predetermined spatial arrangements. Film forming techniques, such as cast molding, photoresist/developing methods, and/or stamping techniques. A film material (or film-forming material) suitable for a substrate, which may become the substrate/submount of the LED device, can be chosen for the deposition of one or more wavelength converting materials. The film material can be organic or inorganic. The wavelength converting materials can be compounded in the film material and/or coated on a surface of the film material. Multiple coatings and/or layers of wavelength converting materials can be deposited, sequentially or concurrently on the film material. The composition, concentration, thickness, and spatial arrangement of the phosphors can be controlled using conventional screen printing and/or photolithographic techniques in combination with deposition, etching, and/or masking processes. The film material can then be embossed with or formed into a polygonal structure such that a three-dimensional dome or globe can be configured about one or more LED elements. The substrate comprising the LED elements can be joined with the formed three dimensional dome. An encapsulant can be used to secure the polygonal structure to the substrate or submount.

In any of the above manufacturing embodiments, an encapsulating material (not shown) may be provided over the diode(s), e.g. silicon, polyacrylates, etc, as refractive intermediary between the relatively high-index semiconductor and air and/or as diffusing lens, to enhance out coupling of the primary light from the diode(s).

The polygonal film material 81 and 101 can be fabricated of plastic (e.g. polycarbonate, polyurethane, polyacrylate, or silicone). These materials are relatively inexpensive and can relatively easily be molded using a suitable die to provide the desired polygonal structure. Alternatively, the polygonal structure is made of a ceramic material including glasses or oxides which can be etched or cast or sintered and in some cases heat formed to provide the polygonal structure. Combinations of materials, such as ceramics and plastics can also be used.

In combination with the above aspects, the one or more additional wavelength converting material(s) can be coated on the outer side of the globe, i.e. at the side facing away from the LED element(s), forming a layer or shell over the globe. Thus, a separate layer can be attached to the globe.

Methods of Light Color Tuning

In one aspect, the above disclosure provides a method of tuning the color of light produced by a solid state lighting device. In one aspect, at least one LED element emitting one or more primary wavelengths of light; is altered to provide at least one secondary wavelength of light by interacting with the polygonal structure comprising a plurality of edges forming a plurality of facets surrounding the at least one LED element. The polygonal structure comprises a wavelength converting material remotely positioned from the at least one LED element and configured to receive the one or more primary wavelengths of light. In another aspect, two or more of the facets independently comprises one or more of: a predetermined composition of wavelength converting material; a predetermined concentration of wavelength converting material; a predetermined thickness of wavelength converting material; and at least two wavelength converting materials in a predetermined spatial arrangement within the facet or neighboring facets. In this manner, at least a fraction of the primary wavelengths of light is altered by at least one of the wavelength converting materials, or at least a fraction of two or more of the primary wavelengths of light of different wavelength are altered by the at least one wavelength converting material to tune the color point and/or CRI of the solid state lighting device.

The presently disclosed apparatus and method has advantages over the prior art LED modules that place the phosphor in an optic of the LED remote from to the LED element, thus is less susceptible to lumen degradation caused by the heat from the LED. Further, since the surface area of the globe is relatively large, the heat from the Stokes shift spreads over a large area and thus the thermal budget of the luminary may be improved.

In addition, the film materials may be produced separately from the base LED modules, where the film material are made and stored in standard shapes and sizes, phosphor combinations, thickness, concentrations, and spatial arrangement corresponding to certain LED modules. Thereafter, the appropriate film material may be chosen and attached to the appropriate LED module, depending on the desired emission color and application, so as to improve flexibility in the manufacturing process.

In one aspect, the light intensity profile of the far-field angular light intensity distribution of light leaving a LED luminary using the presently disclosed globe would be similar to that of an incandescent luminary.

Figure 12:
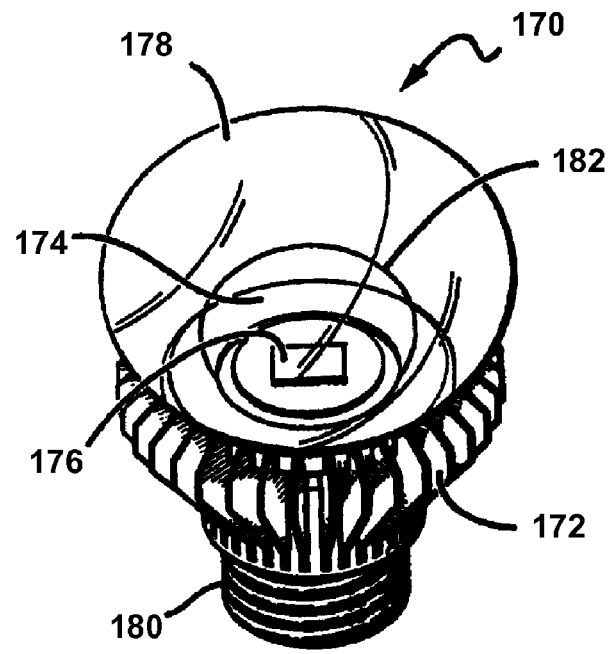
FIG. 12 is a perspective view of an embodiment of a lamp according to the present disclosure.
Figure 13:
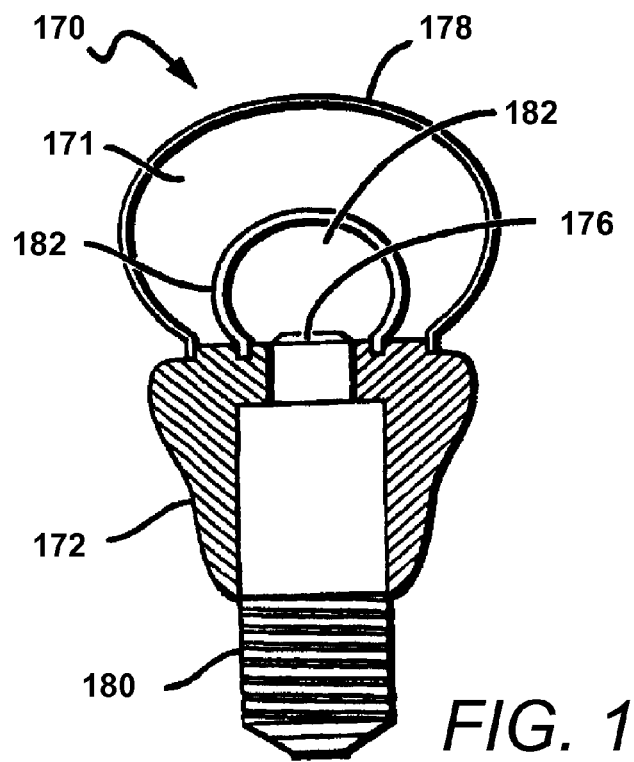
FIG. 13 is a sectional view of the lamp shown in FIG. 12.
Figure 14:
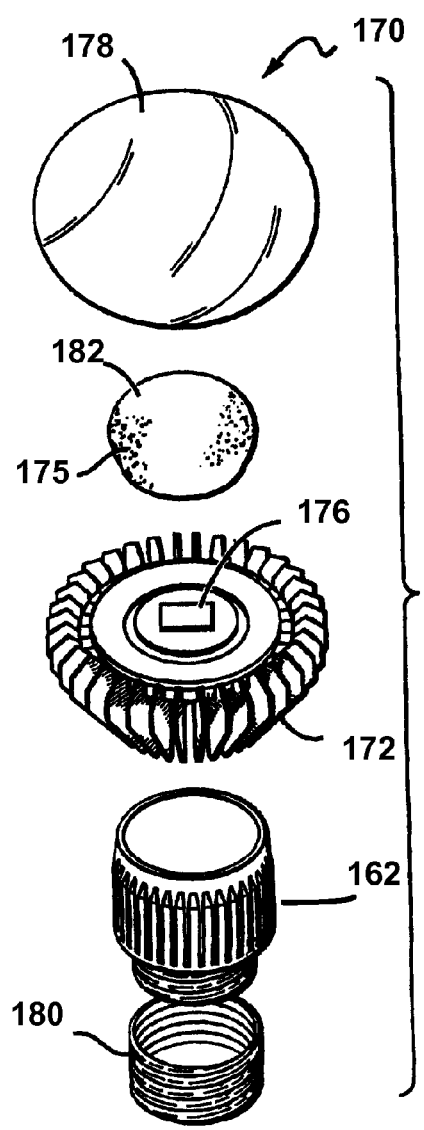
FIG. 14 is an exploded view of the lamp shown in FIG. 12.

FIGS. 12 through 14 show an embodiment of a lamp 170 according to the present disclosure having a heat sink structure 172, optical cavity 174, light source 176, diffuser dome 178 defining a volume 171, body portion 162 and a screw-threaded portion 180. These features can be made of materials and methods as are known in the art. For example, the diffuser can comprise a scattering film/particles and associated carrier such as a glass enclosure, and can serve to scatter or re-direct at least some of the light emitted by the light source and/or phosphor carrier to provide a desired beam profile. The properties of the diffuser, such as geometry, scattering properties of the scattering layer, surface roughness or smoothness, and spatial distribution of the scattering layer properties may be used to control various lamp properties such as color uniformity and light intensity distribution as a function of viewing angle. This embodiment also comprises a three-dimensional polygonal structure 182 having a plurality of edges forming facets and comprising a wavelength converting material of predetermined composition, concentration, thickness, or spatial arrangement within or on the facet or neighboring facets (e.g., a phosphor, optionally the polygonal structure as a carrier that includes a thermally conductive transparent material and at least one phosphor compound and/or phosphor layer). Depending on the embodiment, the polygonal structure 182 comprises a phosphor or phosphor layer(s) 175 on an inside, outside and/or embedded within. In this embodiment, the polygonal structure 182 is on (e.g., mounted to the heat sink structure 172 and thermally coupled or connected to the heat sink structure 172. In other embodiments, an electrically insulating element (not shown) can be between the heat sink structure and the polygonal structure 182, and the polygonal structure 182 can be retained by the electrically insulating element. The electrically insulating element can include opening(s) over the light source 176 (e.g., LEDs) to allow the light to pass through while covering the heat sink structure 172 to protect against electrical shock. In some embodiments, the electrically insulating element can also act as a reflector. In this embodiment, the polygonal structure 182 is a polygonal structure with a plurality of facets in a substantially a hemispherical shape, e.g., the facets of the polygonal structure have angles greater than 90 degrees and less than 180 degrees so as to provide a globe or sphere shaped optical element and the solid state light emitters are arranged so that light from the light source passes through the polygonal structure 182 where at least some of it is converted.

The three dimensional shape of the polygonal structure 182 provides natural separation between it and the light source 176. Accordingly, in one aspect, the light source 176 is not mounted in a recess in the heat sink that forms the optical cavity. Instead, in this embodiment, the light source 176 is mounted on the top surface of the heat sink structure 172, with the optical cavity 174 formed by the space between the polygonal structure 182 and the top of the heat sink structure 172. This arrangement can allow for a less Lambertian emission from the optical cavity 174 because there are no optical cavity side surfaces to block and redirect sideways emission.

Figure 15:
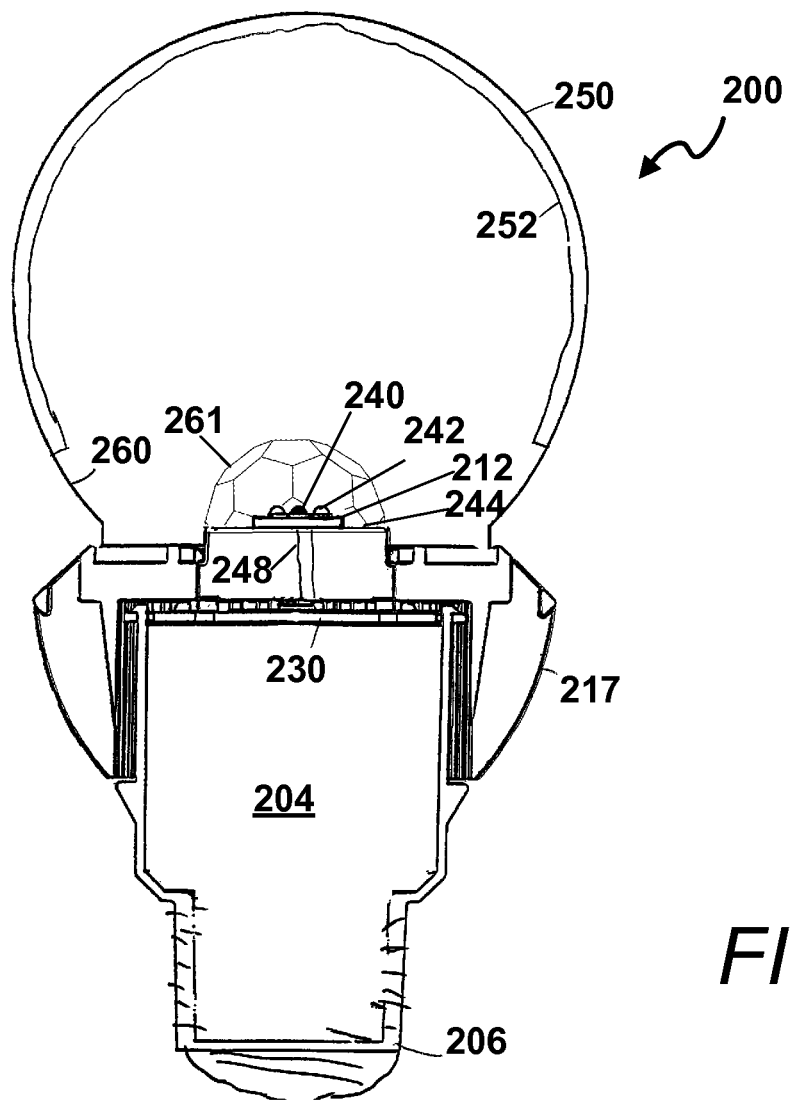
FIG. 15 is a partial sectional view of a lamp according to an embodiment of the present disclosure.

In another embodiment, FIG. 15 shows a side view of lamp, 200, including polygonal structure 261 having a plurality of edges forming facets, the polygonal structure comprising at least one wavelength converting material of predetermined composition, concentration, thickness, or spatial arrangement within or on the facet or neighboring facets according to another embodiment of the present disclosure. Lamp 200 can be omnidirectional. FIG. 15 is shown in as a partial cross section. In the case of FIG. 15, an LED assembly having modules 240 and 242, has been interconnected with power supply portion 204 of the lamp. The power supply portion 204 of the lamp includes a power supply consisting of circuitry to provide direct current to the LED assembly. By way of example, the particular power supply portion of an LED lamp shown in FIG. 15 includes an Edison base, 206. The Edison base can engage with an Edison socket so that this example LED lamp 200 can replace a standard incandescent bulb. The electrical terminals of the Edison base are connected to the power supply to provide AC power to the power supply. LED assembly can include multiple LED modules mounted on a carrier such as circuit board 212 or other substrate/submount, which provides both mechanical support and electrical connections for the LEDs. Heat sink 217 and thermal isolation device 230 are provided. The heat sink design can vary, for example, the heat sink may have more extended curved fins, more or fewer fins, etc. A heat sink may be provided that has a more decorative appearance.

Still referring to FIG. 15, LED assembly can comprise, for example, nine LED packages or LED modules, in which an LED chip is encapsulated inside a package with a lens (and/or polygonal structure) and leads. Each LED module is mounted in circuit board 212. The LED modules include LEDs operable to emit light of two different colors. In this example embodiment, the LED modules on the LED assembly in the lamp of FIG. 15 include a group of LEDs, wherein each LED in module 240, when the LED is illuminated, emits light having dominant wavelength from 440 to 480 nm. The LED modules on the LED assembly in the lamp of FIG. 15 include another group of LEDs, wherein each LED in module 242, when the LED is illuminated, emits light having a dominant wavelength from 605 to 630 nm. In this example, one or more composition, concentration, thickness or spatial arrangement of phosphors about polygonal structure 261 is provided adjacent each LED of the first group at such that some of the light from the LED goes through the phosphor, while other light is absorbed and the wavelength is converted by the phosphor to form a BSY+R LED assembly. In other embodiments, multiple, smaller polygonal structures associated with each module can be used alone and/or together with polygonal structure 261.

The LED assembly can be fastened to the support with adhesive, or any of various fastening mechanisms. Support 244 is installed on the pedestal in this example, disposed between LED assembly 202 and the power supply. Support 244 in this example embodiment is a thin reflective surface, which serves to enhance the light output and light distribution of lamp 200, but can be conical. The surface of the reflective surface can be adjusted by setting the angle through altering the height and size and shape of the LED assembly or the base, and by surface treatment to adjust the reflectivity of the outer surface. Wires 248 pass through a void inside the reflective surface of lamp 200 and interconnect LED modules 240 and 242 with the power supply.

Lamp 200 of FIG. 15 is shown with enclosure 250. In this particular embodiment, enclosure 250 provides color mixing or diffuser in section 252 so that color hot spots do not appear in the light pattern being emitted from the lamp. This section of enclosure 250 may be frosted, painted, etched, roughened, may have a molded in pattern, or may be treated in many other ways to provide color mixing for the lamp. The enclosure may be made of glass, plastic, or some other material that passes light. Section 252 is preferably on or in the interior surface of enclosure 250, for example, the surface facing the LED assembly. The color mixing treatment imparts a particular transmittance-to-reflectance ratio to the enclosure, since some light is necessarily reflected and light reflected from one portion of the enclosure may eventually pass out of the lamp at some other portion of the enclosure. Enclosure 250 in the illustrated embodiment of FIG. 15 includes a substantially transparent section 260. Transparent section 260 is disposed opposite the reflective surface support 244 and allows some of the light reflected from section 252 to leave the lamp relatively unimpeded. By "substantially transparent" what is meant is that for light impinging on section 260 much more light is transmitted than is reflected. Such a section may be as transparent as can reasonably be achieved with normal manufacturing methods, such that it appears transparent to the eye, or it may appear translucent to the eye, notwithstanding the fact that its transmittance-to-reflectance ratio is different than that for the rest of the enclosure. In one embodiment, the polygonal structure can be a single structure of approximately the interior perimeter of the enclosure 250. The polygonal structure can be formed on or in the interior perimeter of enclosure 250, for example, by depositing the film material (and/or phosphor(s)) shaped to include the polygonal structure. Alternatively, the polygonal structure can be formed on or in the interior perimeter surface of enclosure 250, for example, depositing the film material and then forming a polygonal structure on or in the surface of the film facing the LED assembly, for example by laser etching or machining.

In some embodiments, the LED lamp 200 has a correlated color temperature (CCT) from about 1200K to 3500K. In various embodiments, the LED lamp can have a luminous efficacy of at least 100 lumens per watt, at least 90 lumens per watt, at least 75 lumens per watt, or at least 50 lumens per watt. In some embodiments, the LED lamp 200 has a luminous intensity distribution that varies by not more than 10% from 0 to 150 degrees from the top of the lamp. In some embodiments, the lamp 200 has a luminous intensity distribution that varies by not more than 20% from 0 to 135 degrees. In some embodiments, at least 5% of the total flux from the lamp is in the 135-180 degree zone. In some embodiments, the lamp has a luminous intensity distribution that varies by not more than 30% from 0 to 120 degrees. In some embodiments, the LED lamp 200 has a color spatial uniformity of such that chromaticity with change in viewing angle varies by no more than 0.004 from a weighted average point. In some embodiments, the LED lamp 200 conforms to the product requirements for luminous efficacy, color spatial uniformity, light distribution, color rendering index, dimensions and base type of a 60-watt incandescent replacement for the L prize. In some embodiments, the LED assembly includes LED packages emitting blue-shifted yellow and red/orange light. In some embodiments, the LED assembly of the LED lamp 200 includes an LED array with at least two groups of LEDs, wherein one group, if illuminated, would emit light having dominant wavelength from 440 to 480 nm, and another group, if illuminated, would emit light having a dominant wavelength from 605 to 630 nm. In some embodiments LEDs in one group are at least partially surrounded with a polygonal structure comprising at least one wavelength converting material, which, when excited, emits light having a dominant wavelength from 560 to 580 nm. In some embodiments, one group of LEDs is arranged in two strings with the other group of LEDs arranged in a single string between the two strings. In some embodiments one group of LEDs, if illuminated, would emit light having dominant wavelength from 435 to 490 nm, and another group, if illuminated, would emit light having a dominant wavelength from 600 to 640 nm. In some embodiments LEDs in one group are at least partially surrounded with a polygonal structure comprising at least one wavelength converting material, which, when excited, emits light having a dominant wavelength from 540 to 585 nm.

In still other embodiments according to the present disclosure, the LED component can comprise a plurality of series connection circuits comprising LED chips that emit light directly from their active region, with at least one series circuit provided for red, green and blue emitting LEDs, respectively. In other embodiments, series connected LEDs circuits can also be added emitting cyan, yellow and/or amber. The LED component preferably emits a white light combination of light from the series circuits that has a high color rendering index of greater than 85. The globe can comprise a plurality of independent polygonal shapes, two or more of which is chosen to maximize one or more of color shifting, reflection, and/or transmission of one or more wavelengths of light from such an array of LED chips. Likewise, the globe starting material (e.g., film material) can be chosen to maximize the transmission of the many wavelengths of light and/or to attenuate a predetermined wavelength(s) of light for a particular optical affect (e.g., diffuser, etc).

In another embodiment, the LED luminary can comprise a single or plurality of series connection LED circuits, with the polygonal structured globe comprising one or more phosphors configured in a predetermined composition, concentration, thickness and/or spatial arrangement. The combined LED and phosphor emission can cover different spectral ranges such as blue, green, yellow and red spectral ranges. The mixed emission can be cool or warm white light with a color point on the black body locus or within an 8-step Mac Adam ellipse thereof with high color rendering index of greater than 70, greater than 80, greater than 85, and greater than 90.

The submount of the LED device can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polyimide and polyester etc. In the preferred embodiment, the dielectric material has a high thermal conductivity such as with aluminum nitride and silicon carbide. In one aspect, the film material used to form the polygonal structure is also the submount of the LED device as discussed above.

When light from a light source is absorbed by the wavelength converting material in the polygonal structure, it is re-emitted in isotropic directions with approximately 50% of the light emitting forward and 50% emitting backward towards the LED. In prior LEDs having conformal phosphor layers, a significant portion of the light emitted backwards can be directed back into the LED and its likelihood of escaping is limited by the extraction efficiency of the LED structure. For some LEDs the extraction efficiency can be approximately 70%, so a percentage of the light directed from the conversion material back into the LED can be lost. In other aspects of the above embodiments, the submount 64 can also comprise additional highly reflective material, such as reflective ceramic or metal layers like silver, to enhance light extraction from the component. The surface of the submount 64 can be pre-treated with adhesion promoters and/or coupling agents known in the art to improve the adhesion of the polygonal structure to the surface of the submount.

In other embodiments the submount 64 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

It is understood that LED components according to the present disclosure can be fabricated using a method that incorporates submount panel or wafer comprising a plurality of submounts. Each of the submounts 64 can be formed with its own array of LEDs and polygonal structured optical elements such that multiple LED chips 62 can be formed across the submount panel as discussed below. Multiple LED chips 62 can then be singulated from the submount panel. Each submount 64 may also comprise a more complex combination of elements such as a plurality of "submount" assemblies which are mounted on a planar surface of submount. The submount assemblies can have different functionalities such as providing electrostatic discharge (ESD) protection for the various LED chips.

The size of the submount 64 in LED package 60 can vary depending on certain factors such as the size and number of LEDs. It is understood that the submount 64 can have essentially any shape, such as circular, oval, rectangular, hexagonal, or other multiple sided shapes.

In another embodiment, single LED element luminary packages can also be provided. The LED device can be configured as a flip chip LED package.

It is understood that the LED chips in the arrays including the polygonal structure optical element as herein disclosed and described can be arranged as one or more multiple multi-chip LED lamps as described in U.S. Patent Publication No. 2007/0223219 entitled "Multi-Chip Light Emitting Device for Providing High-CRI Warm White Light and Light Fixtures Including the Same", the disclosure of which is incorporated by reference.

The polygonal structure optical elements and methods of manufacturing presently disclosed are generally applicable to a variety of existing lighting packages, for example, XLamp products XM-L, ML-B, ML-E, MP-L EasyWhite, MX-3, MX-6, XP-G, XP-E, XP-C, MC-E, XR-E, XR-C, and XR LED packages manufactured by Cree, Inc. The benefits in luminous flux can be applied to many lighting applications, for example, commercial/retail display spotlights, LED retrofit bulbs, and other indoor and outdoor general-illumination applications.

The above has been described both generically and with regard to specific embodiments. Although the present disclosure has been set forth in what is believed to be the preferred embodiments, a wide variety of alternatives known to those of skill in the art can be selected within the generic disclosure. Other advantages and obvious modifications of the present disclosure will be apparent to the artisan from the above description and further through practice of the present disclosure.

I claim:

1. A solid state lighting device comprising:
   at least one LED element positioned on a top surface of a substrate or a submount; and
   an optical element comprising an interior surface and an exterior surface with a semi-spherical or spherical shape, the optical element comprising a plurality of facets where each of the plurality of facets comprises a cyclic polygon and each of the plurality of facets comprises a plurality of edges where at least one of the plurality of edges of each of the plurality of facets forms and edge of an adjacent one of the plurality of facets such that the plurality of facets defines the semi-spherical or spherical shape over the entire interior surface and the entire exterior surface of the optical element, the optical element comprising a wavelength converting material and being configured such that the plurality of facets receive light from the at least one LED element substantially simultaneously, wherein the wavelength converting material is remotely positioned from the at least one LED element wherein two or more of the plurality of facets independently comprises at least two different wavelength converting materials or wherein each of two adjacent facets comprises a different wavelength converting material.

2. The solid state lighting device of claim 1, wherein two or more of the plurality of facets independently comprises a predetermined composition of wavelength converting material.

3. The solid state lighting device of claim 1, wherein two or more of the plurality of facets independently comprises a predetermined concentration of wavelength converting material.

4. The solid state lighting device of claim 1, wherein two or more of the plurality of facets independently comprises a predetermined thickness of wavelength converting material.

5. The solid state lighting device of claim 1, wherein two or more of the plurality of facets independently comprises at least two of:
   a predetermined composition of wavelength converting material;
   a predetermined concentration of wavelength converting material;
   a predetermined thickness of wavelength converting material; and
   at least two wavelength converting materials in a predetermined spatial arrangement within the facet or neighboring facets.

6. The solid state lighting device of claim 1, comprising at least two LED elements, wherein one or more of the at least two LED elements emit light of different wavelengths.

7. The solid state lighting device of claim 1, comprising at least two LED elements, wherein one or more of the at least two LED elements emit light of different wavelengths and wherein two or more of the plurality of facets independently comprises at least two of:
   a predetermined composition of wavelength converting material;
   a predetermined concentration of wavelength converting material;
   a predetermined thickness of wavelength converting material; and at least two wavelength converting materials in a predetermined spatial arrangement within the facet or neighboring facets.

8. The solid state lighting device of claim 1, wherein the optical element comprises at least five facets.

9. The solid state lighting device of claim 1, wherein the optical element at least partially surrounds the at least one LED element.

10. The solid state lighting device of claim 1, wherein the cyclic polygon includes n-gons having internal angles greater than 90 degrees up to but less than 180 degrees.

11. The solid state lighting device of claim 1, wherein the ratio of the at least one LED element width and facet width is from 2:1 to 2000:1.

12. A method of tuning the color of light produced by a solid state lighting device, the method comprising;
providing at least one LED element emitting one or more primary wavelengths of light;
providing an optical element comprising an interior surface and an exterior surface with a semi-spherical or spherical shape, the optical element comprising a plurality of facets where each of the plurality of facets comprises a cyclic polygon and each of the plurality of facets comprises a plurality of edges where at least one of the plurality of edges of each of the plurality of facets forms and edge of an adjacent one of the plurality of facets such that the plurality of facets defines the semi-spherical or spherical shape over the entire interior surface and the entire exterior surface of the optical element, the optical element configured such that the plurality of facets receive the one or more primary wavelengths of light substantially simultaneously and comprising at least one wavelength converting material, wherein the wavelength converting material is remotely positioned from the at least one LED element;
wherein two or more of the plurality of facets independently comprises at least two different wavelength converting materials or wherein each of two adjacent facets comprises a different wavelength converting material; and
altering at least one of the primary wavelengths of light using the optical element to provide at least one secondary wavelength of light.

13. The method of claim 12, wherein two or more of the plurality of facets independently comprises a predetermined composition of wavelength converting material.

14. The method of claim 12, wherein two or more of the plurality of facets independently comprises a predetermined concentration of wavelength converting material.

15. The method of claim 12, wherein two or more of the plurality of facets independently comprises a predetermined thickness of wavelength converting material.

16. The method of claim 12, wherein two or more of the plurality of facets independently comprises at least two of:
a predetermined composition of wavelength converting material;
a predetermined concentration of wavelength converting material;
a predetermined thickness of wavelength converting material; and
at least two wavelength converting materials in a predetermined spatial arrangement within the facet or neighboring facets.

17. The method of claim 12, comprising at least two LED elements that emit primary wavelengths of light of different wavelengths.

18. The method of claim 17, wherein two or more of the plurality of facets independently comprises at least two of:
a predetermined composition of wavelength converting material;
a predetermined concentration of wavelength converting material;
a predetermined thickness of wavelength converting material; and
at least two wavelength converting materials in a predetermined spatial arrangement within the facet or neighboring facets.

19. The method of claim 17, wherein at least a fraction of the primary wavelengths of light is altered by at least two of the wavelength converting materials.

20. The method of claim 17, wherein at least a fraction of two or more of the primary wavelengths of light of different wavelength are altered by the at least two wavelength converting materials.

21. The method of claim 12, wherein the optical element comprises at least five facets.

22. The method of claim 12, wherein the optical element at least partially surrounds the at least one LED element.

23. The method of claim 12, wherein cyclic polygon includes n-gons having obtuse internal angles greater than 90 degrees up to but less than 180 degrees.

24. The solid state lighting device of claim 12, wherein the ratio of the at least one LED element width and facet width is from 2:1 to 2000:1.

* * * * *